(12) United States Patent
Jones

(10) Patent No.: US 7,049,986 B1
(45) Date of Patent: May 23, 2006

(54) FUSE LINK TRIM ALGORITHM FOR MINIMUM RESIDUAL

(75) Inventor: Mark A. Jones, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/988,672

(22) Filed: Nov. 15, 2004

(51) Int. Cl.
*H03M 1/10* (2006.01)
(52) U.S. Cl. ..................................... 341/121
(58) Field of Classification Search ............... 341/172, 341/150, 120, 145, 156, 121; 365/96, 225.7
See application file for complete search history.

(56) References Cited

U.S. PATENT DOCUMENTS

| | | | | |
|---|---|---|---|---|
| 4,399,426 A | * | 8/1983 | Tan | 341/120 |
| 6,151,238 A | * | 11/2000 | Smit et al. | 365/96 |
| 6,433,714 B1 | * | 8/2002 | Clapp et al. | 341/121 |
| 6,448,911 B1 | * | 9/2002 | Somayajula | 341/120 |

* cited by examiner

*Primary Examiner*—Brian Young
(74) *Attorney, Agent, or Firm*—W. Daniel Swayze, Jr.; W. James Brady; Frederick J. Telecky, Jr.

(57) ABSTRACT

A parameter of an integrated circuit including a first trim array and a second trim array is trimmed by measuring an initial value of the parameter, determining whether the parameter exceeds a reference value, and as long as the parameter exceeds the reference value, repetitively blowing fuses associated with binarily weighted trim elements of the first trim array to eliminate trim contributions thereof to thereby decrease the parameter by weighted amounts corresponding to a present trim array bit number value until either all fuses of the first trim array have been blown or enough have been blown to cause the parameter to be less than a −LSB/2 weight. If the parameter then is less than the −LSB/2 weight, a fuse of the second trim array corresponding to a present bit number is blown to increase the parameter to greater than a +LSB/2 weight. The procedure is repeated until all fuses in one trim array have been blown, to thereby minimize the number of residual trim elements.

30 Claims, 4 Drawing Sheets

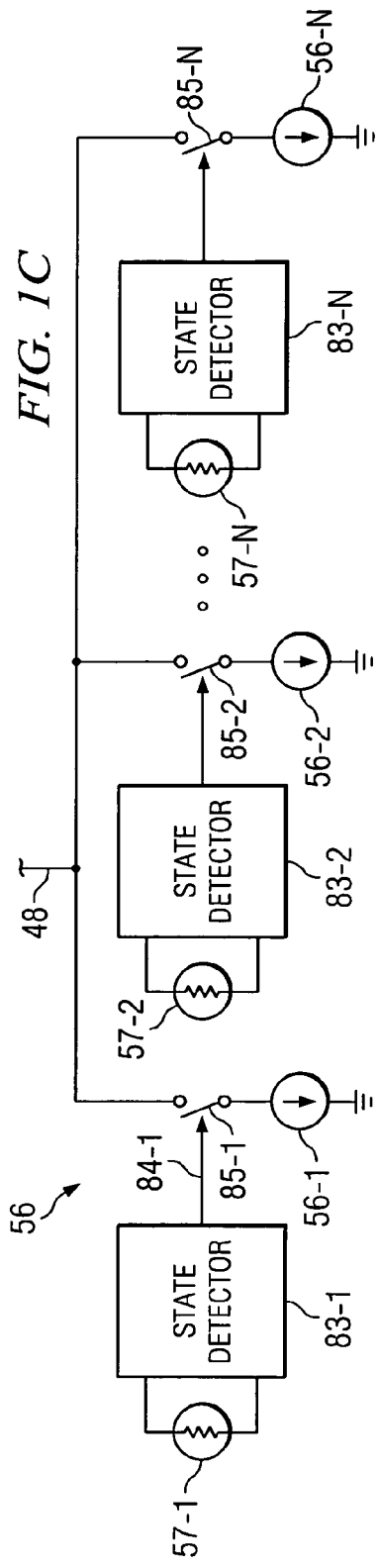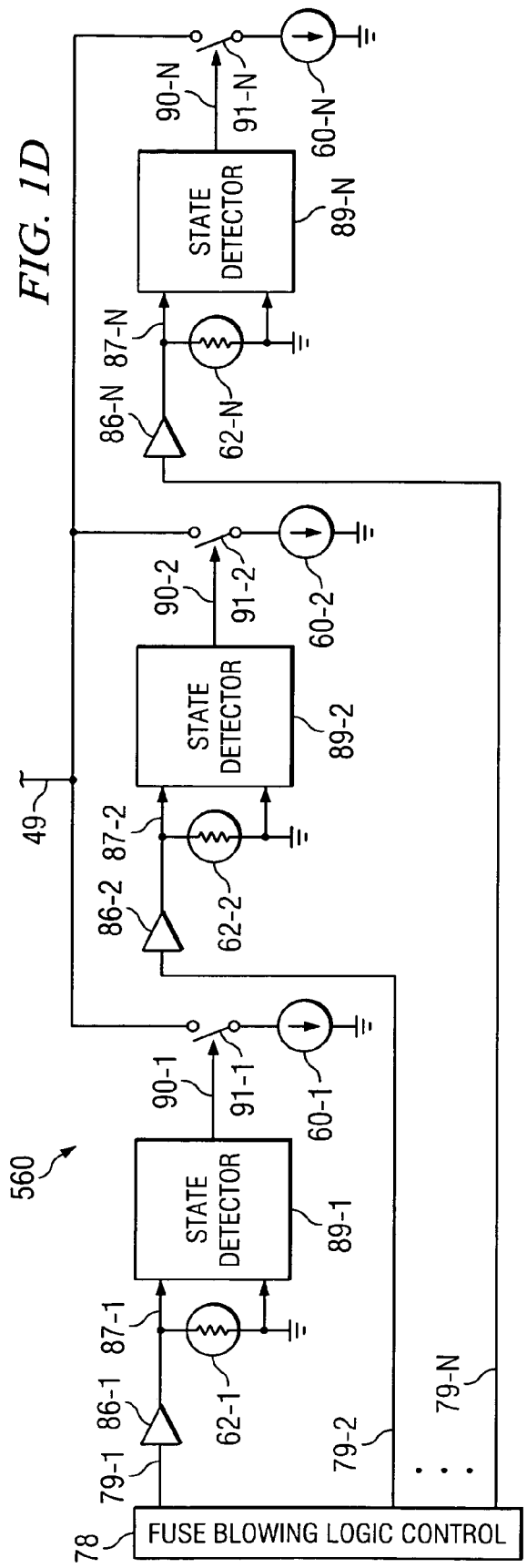

FUSE LINK TRIM ALGORITHM FOR MINIMUM RESIDUAL

BACKGROUND OF THE INVENTION

The present invention relates generally to systems and techniques for trimming a parameter such as input offset voltage of an amplifier to a particular target value by blowing/cutting fuse links, and more particularly to systems and techniques for avoiding the presence of "residual" un-blown or un-cut fuse links after the trimming process is complete. This is because the presence of residual links and corresponding residual trim currents can diminish circuit performance.

The invention also relates to avoiding the need for a-priori knowledge of "trim step" sizes before successful trimming can be initiated. For example, if an operational amplifier is to be trimmed so as to have a particular input offset voltage wherein a differential input transistor pair has a particular transconductance, that results in a particular output current of the differential input transistor pair being applied as input to a folded cascode stage. The junction point or conductor in which that current flows is a good point at which to inject a precise amount of DC current to counter or reduce an initial value of the measured input offset voltage.

Typically, two banks or arrays of fused binarily weighted trim current sources are provided, one on the "positive" side and the other on the "negative" side of the differential input transistor pair. For example, one array of the binarily weighted trim current sources is connected to the collector of a bipolar input transistor (or the drain of an MOS input transistor) on the (+) side of the differential input transistor pair and the other array of the binarily weighted trim current sources is connected to the collector of the bipolar input transistor (or the drain of an MOS input transistor) on the (−) side of the differential input pair. Each binarily weighted trim current source is connected in series with a corresponding un-blown fuse or un-cut laser-cut above link such that all of the binarily weighted "bits", i.e., current sources initially are "on". Consequently, a maximum, equal value of trim current initially are injected into the collector (or drain) nodes of each of the (+) and (−) sides of the differential input transistor pair. The differential input transistor pair initially is in a "balanced" condition except for the effects of the initial input offset voltage of the differential input pair, with the maximum possible amount of trim current (or trim voltage or other trim parameter) being initially applied to the collectors (or drains) of the input transistors of both the (+) and (−) sides of the differential input pair. Trimming of the input offset voltage is accomplished by selectively blowing fuses or laser-cutting links, one at a time, in the trim array on one side of the differential input transistor pair, and each time measuring the offset voltage until it has been reduced to an acceptable value.

The above described prior art trimming technique leaves a substantial residual trim current being applied to at least one side of the differential input transistor pair on which no fuses have been blown or on which no links have been laser-cut, because of the presence of residual trim elements still injecting increments of trim current into both the (+) and (−) sides of the differential input pair even after the offset voltage has been trimmed to an acceptable value. The presence of the residual trim elements and corresponding residual trim currents is undesirable because it makes the circuit more susceptible to thermal drift and power supply drift, and may also increase circuit noise and power consumption. This prior art application requires accurate foreknowledge of the trim weights and associated device gain (such as input stage transconductance) and may also require the use of redundant trim bits to account for inaccurate a-priori information.

In another typical prior art application, a single bank or array of weighted trim elements can be turned on and applied either in the positive direction or the negative direction, i.e., applied to either the positive side or the negative side of the differential input transistor pair. The magnitude of the trim elements is determined by an initial measurement and a calculation based on the a-priori weights of the trim cells. This prior art application also requires accurate foreknowledge of the trim weights and associated device gain (such as input stage transconductance) and may also require the use of redundant trim bits to account for inaccurate a-priori information.

Thus, there is an unmet need for an improved differential trimming technique that reduces input offset voltages associated with a differential input stage and also reduces thermal drift, power supply drift, circuit noise, and/or power consumption of the differential input stage.

There also is an unmet need for an improved differential trimming technique that reduces input offset voltages associated with a differential input stage and also reduces or eliminates the presence of residual trim elements and corresponding residual trim currents associated with prior art differential integrated circuit trimming techniques even after the prior trim processes have been completed.

There also is an unmet need for an improved differential trim technique which does not depend on accurate a-priori knowledge of trim bit weights or device characteristics.

SUMMARY OF THE INVENTION

It is an object of the invention to provide an improved differential trimming technique that reduces input offset voltages associated with a differential input stage and also reduces thermal drift, power supply drift, circuit noise, and/or power consumption of the differential input stage.

It is another object of the invention to provide an improved differential trimming technique that reduces input offset voltages associated with a differential input stage and also reduces or eliminates the presence of residual trim elements and corresponding residual trim currents associated with prior art differential integrated circuit trimming techniques even after the prior trim processes have been completed.

It is another object of the invention to provide an improved differential trimming technique which does not rely on accurate foreknowledge of effective bit weights begin performing trim.

Briefly described, and in accordance with one embodiment, the present invention provides a system and technique for trimming a parameter of an integrated circuit including a first trim array and a second trim array is trimmed by measuring an initial value of the parameter, determining whether the parameter exceeds a reference value, and as long as the parameter exceeds the reference value, repetitively blowing fuses associated with binarily weighted trim elements of the first trim array to eliminate trim contributions thereof to thereby decrease the parameter by weighted amounts corresponding to a present trim array bit number value until either all fuses of the first trim array have been blown or enough have been blown to cause the parameter to exceed a −LSB/2 weight. If the parameter then exceeds the −LSB/2 weight, a fuse of the second trim array corresponding to a present bit number is blown to decrease the parameter to a less than the −LSB/2 weight. The procedure is repeated until all fuses in the first trim array have been blown, to thereby approximately minimize the number of residual trim elements.

In the described embodiment, a technique is provided for trimming a parameter (Vos) of an integrated circuit including first (48) and second (49) conductors each of which can be incrementally adjusted to accomplish trimming of the parameter (Vos). The integrated circuit also includes a first trim array (56) including a plurality of weighted trim elements (56-1,2 . . . N) each having a corresponding bit number and each coupled to a corresponding interruptible link (57-1,2 . . . N) which determines whether that trim element is operatively coupled to the first conductor (48). The integrated circuit also includes a second trim array (60) including a plurality of weighted trim elements (60-1,2 . . . N) each having the same bit number as a corresponding weighted trim element of the first trim array (56) and each coupled to a corresponding interruptible link (62-1,2 . . . N) which determines whether that trim element is operatively coupled to the second conductor (49). The technique includes measuring an initial value of the parameter (Vos) and determining whether the parameter (Vos) exceeds a predetermined reference value. As long as the parameter (Vos) exceeds the predetermined reference value, links (57-1 etc.) of the first trim array (56) having a bit number ("bit") are repetitively interrupted and the bit number is decremented to decrease the parameter (Vos) by weighted amounts corresponding to the bit number values, wherein an initial value of the bit number is equal to the bit number of an MSB of the trim arrays, until either all links (57-1 etc.) of the first trim array (56) have been interrupted or enough links (57-1 etc.) of the first trim array (56) have been interrupted to cause the parameter (Vos) to exceed a first accuracy value (−LSB/2). An interruptible link (62-1 etc.) of the second trim array (60) corresponding to the present bit number ("bit") is interrupted if the present value of the parameter (Vos) becomes less than a first accuracy value (−LSB/2) to increase the parameter (Vos) to a value greater than a second accuracy value (+LSB/2). If all of the links (57-1 etc.) in the first trim array (56) have not yet been interrupted, bit number ("bit") is decremented and the foregoing procedure is repeated until all of the all links (57-1 etc.) of the first trim array (56) have been interrupted.

If the initial measurement of the parameter (Vos) does not exceed the first reference value, then as long as the parameter (Vos) is less than the predetermined reference value, links (62-1 etc.) of the second trim array (60) having the present bit number ("bit") are repetitively interrupted and the bit number is decremented to increase the parameter (Vos) by weighted amounts corresponding to the bit number values until enough links (62-1 etc.) of the second trim array (60) have been interrupted to cause the parameter (Vos) to exceed the second accuracy value (+LSB/2). An interruptible link (57-1 etc.) of the first trim array (57) corresponding to the present bit number ("bit") is interrupted if the present value of the parameter (Vos) exceeds the second accuracy value (+LSB/2) to decrease the parameter (Vos) to a value less than the first accuracy value (+LSB/2). If all of the all links (62-1 etc.) in the second trim array (60) have not yet been interrupted, the present bit number ("bit") is decremented and the foregoing procedure is repeated until all of the links (62-1 etc.) of the second trim array (60) have been interrupted.

In the described embodiments, the integrated circuit includes an operational amplifier and the parameter is an input offset voltage of the operational amplifier. In one embodiment, each interruptible link includes a fuse, and interrupting of the interruptible link includes blowing the fuse. In another embodiment, each interruptible link includes a laser-cuttable link, and interrupting of the interruptible link includes laser-cutting the laser-cuttable link. The predetermined accuracy value has a magnitude equal to half of the magnitude of the accuracy value of a least significant bit (LSB) of the first trim array (56). A processor (73) is operated in order to perform the trimming procedure.

BRIEF DESCRIPTION OF THE DRAWINGS

FIG. 1C is a detailed block diagram of positive side trim array 56 of FIG. 1A.

FIG. 1D is a detailed block diagram of positive side trim array 560 of FIG. 1B.

DETAILED DESCRIPTION OF THE PREFERRED EMBODIMENTS

The method and structure of the present invention are utilized to selectively control blowing of fuses or laser-cutting of links in binarily weighted current sources, in order to trim a circuit parameter, such as an input offset voltage, wherein one trim array is connected to a (+) side of a differential input transistor pair of an integrated circuit chip and the other trim array is connected to a (−) side of the input transistor pair. The trimming is performed according to a trimming algorithm to essentially eliminate the above mentioned residual trim elements and associated residual trim currents so that the only trim elements that remain connected to the differential input transistor pair are those necessary to reduce its offset voltage to an acceptable value. This has the effect of making the differential input transistor stage less susceptible to thermal drift, power supply drift, circuit noise, and/or power consumption.

Figure 1A:
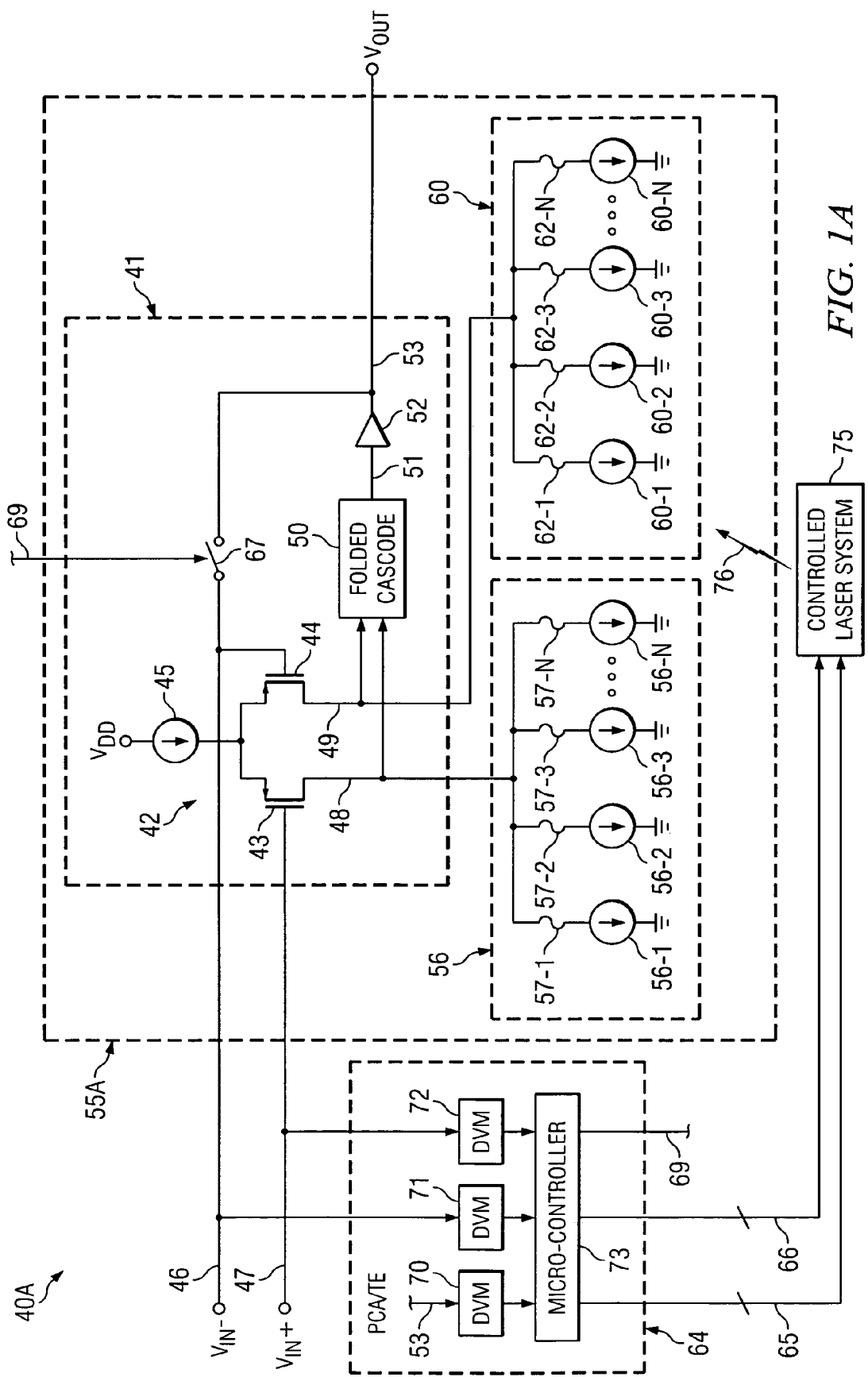
FIG. 1A is a schematic drawing that illustrates automated test/measurement equipment and a trimmable integrated circuit chip including a pair of arrays of binarily weighted trim current sources and associated laser-cuttable links which are cut in accordance with the present invention to trim a parameter of the chip.

Referring to FIG. 1A, a system 40A includes processor-controlled automated test/measurement equipment (PCA/TE) 64 connected to an integrated circuit operational amplifier 55A which includes an "untrimmed" operational amplifier 41, a "positive side" trim array 56 of selectable binarily weighted trim current sources, and a "negative side" trim array 60 of selectable binarily weighted trim current sources.

Untrimmed operational amplifier 41 includes a differential input stage 42 including a P-channel input transistor 43 having a gate connected by a conductor 47 to an input terminal for receiving an input signal Vin+. Differential input stage 42 also includes a P-channel input transistor 44 have a gate connected by a conductor 46 to an input terminal for receiving an input signal Vin−. Input transistors 43 and 44 are referred to as the input transistor pair. Input terminal 47 can be connected to an internal Vin+ bonding pad (not shown) by means of which an external Vin+ package lead (not shown) can be electrically connected to input terminal 47. Similarly, input terminal 46 can be connected to an internal Vin− bonding pad by means of which an external Vin− package lead can be effectively connected to input terminal 46.

An input of processor-controlled automated test/measurement equipment 64 can be connected to Vin+ conductor 47 either by means of the external Vin+ package lead or by means of a probe (not shown), a sharp tip of which is deployed to make electrical contact with the internal Vin+ bonding pad. Another input of processor-controlled automated test/measurement equipment 64 can be connected to Vin− conductor 46 either by means of the external Vin− package lead or by means of another probe, the sharp tip of which is deployed to make electrical contact with the internal Vin− bonding pad.

Untrimmed operational amplifier 41 includes a conventional folded cascode stage 50 having one input connected by a conductor 49 to the drain of input transistor 44 and another input connected by a conductor 48 to the drain of input transistor 43. The sources of input transistors 43 and 44 are connected to one terminal of a tail current source 45. An output of folded cascode stage 50 is connected by conductor 51 to an input of a conventional class AB output stage 52, an output of which is connected to an output conductor 53 on which Vout is produced. Output conductor 53 is also connected to one terminal of a feedback control switch 67, another terminal of which is connected to Vin− conductor 46. A control terminal of feedback control switch 67 is connected to a control conductor 69 of processor-controlled automated test/measurement equipment 64.

Conductor 48 is also connected to an output of positive side trim array 56. Positive side trim array 56 includes N selectable binarily weighted trim current sources 56-1,2 . . . N. Trim current source 56-1 corresponds to the MSB (most significant bit) of N-bit positive side trim array 56, and trim current source 56-N corresponds to the LSB (least significant bit) of N-bit positive side trim array 56. One terminal of each of trim current sources 56-1,2 . . . N is connected to ground, and the other terminal of each of trim current sources 56-1,2 . . . N is coupled to conductor 48 by a conventional laser-cuttable link 57-1,2 . . . N, respectively.

Figure 1B:
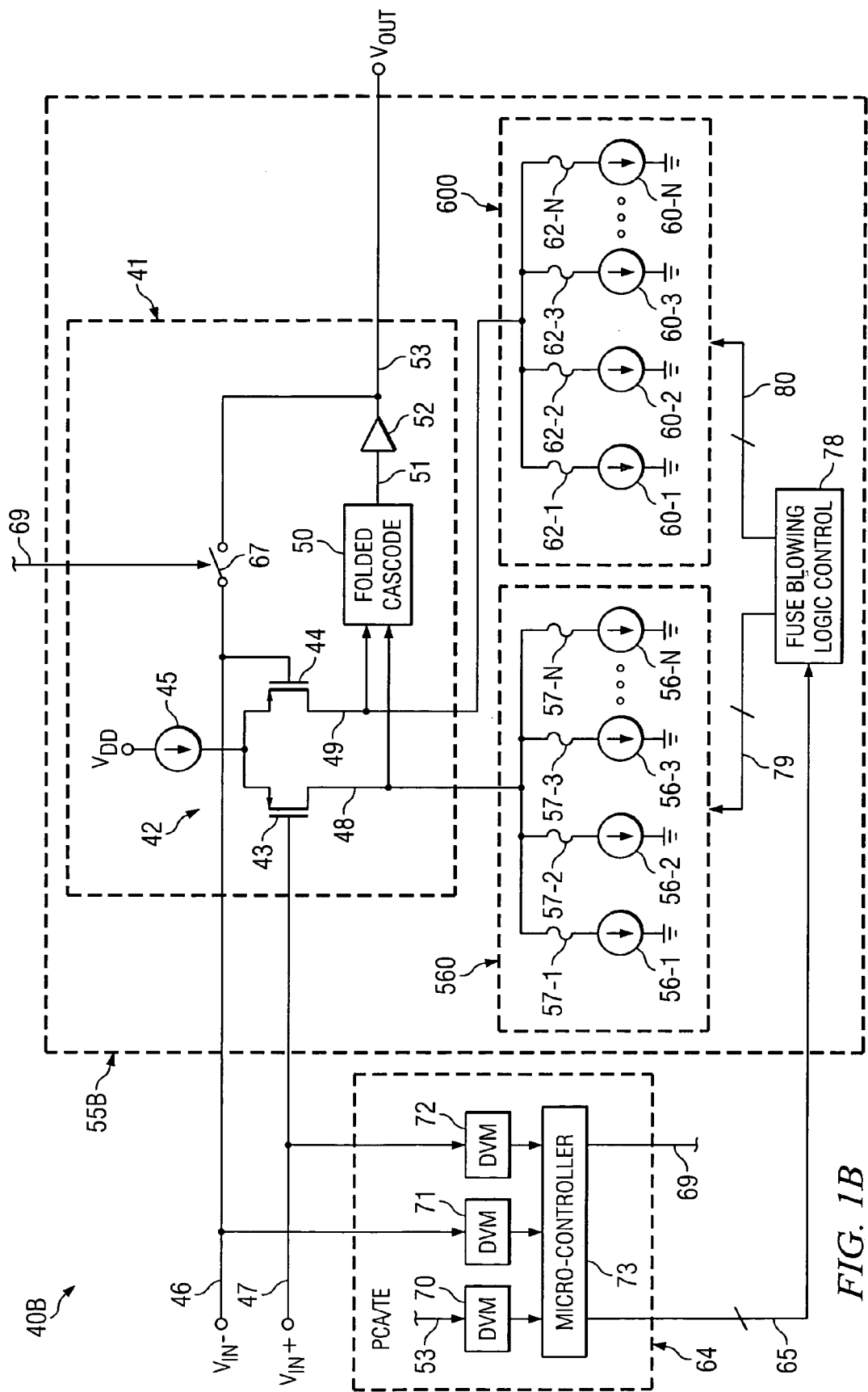
FIG. 1B is a schematic drawing similar to FIG. 1A except that the binarily weighted trim current sources have associated blowable fuses and the chip includes logic circuitry for blowing selected fuses in accordance with the present invention to trim a parameter of the chip.

As a practical matter, the fuses or laser-cuttable links are not normally connected in series with the trim current sources in the manner schematically shown in FIGS. 1A and 1B, because the open circuit impedances of the trim current sources are far from infinite. In practice the fuses or laser-cuttable links ordinarily control the on/off state of integrated silicon switches such as a series MOS transistor which has a much higher open circuit impedance, causing less leakage.

The laser-cuttable links 57-1,2 . . . N are shown in series with trim current sources 56-1,2 . . . N for simplicity in FIG. 1A, but as a practical matter they are more likely to be implemented as shown in FIG. 1C. The block diagram of FIG. 1C illustrates a practical implementation of positive side trim array 56 of FIG. 1A. The terminals of laser-cuttable link 57-1 are connected to inputs of a suitable conventional state detector circuit 83-1. State detector circuit and 83-1 detects whether or not laser-cuttable link 57-1 has been cut, and stores a corresponding "1" or "0" state, and produces a control signal on conductor 84-1, which is coupled to the control terminal of a switch circuit 85-1. Switch circuit 85-1 represents a circuit, such as an MOS transistor, that deactivates and/or decouples MSB trim current source 56-1 from positive side conductor 48 in response to the state stored by state detector circuit 83-1. The remaining bits of trim array 56 are implemented in essentially the same way, with the trim current sources being binarily weighted.

Similarly, conductor 49 is also connected to an output of negative side trim array 60. Negative side trim array 60 includes N binarily weighted trim current sources 60-1, 2 . . . N. Trim current source 60-1 corresponds to the MSB (most significant bit) and trim current source 60-N corresponds to the LSB (least significant bit) of N-bit negative side trim array 51. One terminal of each of trim current sources 60-1, 2 . . . N is connected to ground, and the other terminal of each of trim current sources 60-1,2 . . . N is coupled to conductor 49 by a corresponding conventional laser-cuttable link 62-1,2 . . . N.

Figure 2:
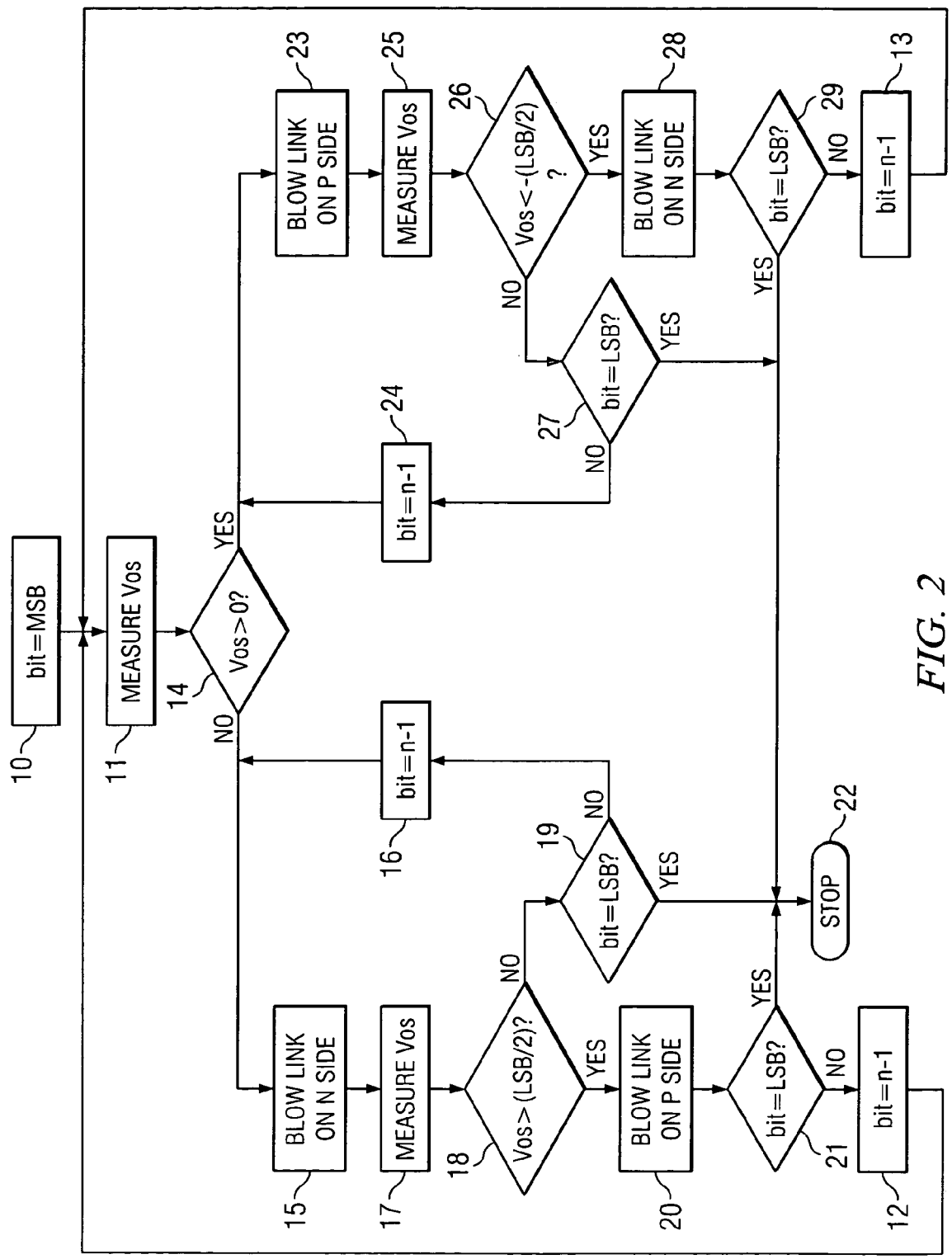
FIG. 2 is a flow chart useful in conjunction with FIG. 1 for describing the differential trimming technique and structure of the present invention.

Processor-controlled automated test/measurement equipment 64 includes a conventional microcontroller 73, which, in accordance with present invention, executes a stored program represented by the flow chart of FIG. 2. Automated test/measurement equipment 64 typically includes conventional measurement instruments, such as digital voltmeters 70, 71 and 72, which receive the measurement signals of the value of Vout conductor 53, the value of Vin− on conductor 46, and the value of Vin+ on conductor 47, so that the present value of the input offset voltage Vos of operational amplifier 55A can be determined. Vos is equal to the value of Vin+minus Vin− which causes Vout to be equal to 0. The measurement signals can be obtained by means of conventional integrated circuit probes that are connected to the inputs of digital voltmeters 70, 71 and 72, respectively, wherein sharp tips of the probes are positioned so as to make electrical contact with test points of conductors 53, 46, and 47, respectively. Digital voltmeter 71 thus has an input coupled in electrical contact with Vin− terminal 46 and an output connected to an input of microcontroller 73. Similarly, digital voltmeter 72 has an input coupled in electrical contact with Vin+ terminal 47 and an output connected to another input of microcontroller 73. Digital voltmeter 70 has an input coupled in electrical contact with output terminal 53 and an output connected to another input of microcontroller 73.

Bus 65 includes conductors for controlling the selecting and laser cutting of laser-cuttable links 62-1,2 . . . Ni negative side trim array 60 in response to various outcomes of executing the trimming algorithm represented by the flow chart of FIG. 2, and bus 66 includes conductors 66 for controlling the selecting and laser cutting of laser-cuttable links 57-1,2 . . . N I positive side trim array 56 in response to various outcomes of a trimming algorithm represented by the flow chart of FIG. 2. Microcontroller 73 is connected to buses 65 and 66 and produces various control signals on the various conductors thereof. The buses 65 and 66 also are connected to a controllable laser system 75 which can precisely aligned and fire a laser beam 76 in response to signals on buses 65 and 66. (Of course, buses 65 and 66 can be combined into a single bus.) Some of the conductors of bus 65 are utilized to precisely align and fire the laser beam 76 of controlled laser system 75 so it can cut selected links in positive side trim array 56 in order to accomplish the needed trimming. Similarly, some of the conductors of bus 66 are utilized to precisely align and fire the laser beam 76 of controlled laser system 75 so it can cut selected links in negative side trim array 60 in order to accomplish the needed trimming.

Fuses 62-1,2 . . . N are shown in series with trim current sources 60-1,2 . . . N for simplicity in FIG. 1B, but as a practical matter they are more likely to be implemented as shown in FIG. 1D. The block diagram of FIG. 1D illustrates a practical implementation of positive side trim array 560 of FIG. 1B. One terminal of fuse 62-1 is connected to ground, and its other terminal is connected to an output conductor 87-1 of a high current driver 86-1 having an its input coupled by conductor 79-1 to fuse blowing logic control circuit 78. Output conductor 87-1 also is connected to an input of a conventional state detector circuit 89-1. State detector circuit 89-1 detects whether or not fuse 62-1 has been blown, stores a corresponding "1" or "0" state, and produces a control signal on conductor 90-1 which is coupled to the control terminal of a switch circuit 91-1. Switch circuit 91-1 represents a circuit, such as a MOS transistor, that deactivates and/or decouples MSB trim current source 60-1 from positive side conductor 49 in response to the state stored by state detector circuit 89-1. The remaining bits of trim array 560 are implemented in essentially the same way, with the trim current sources being binarily weighted.

Preferably, all unneccessary trim current sources are disabled, reducing overall current draw from the supply, and of course, those skilled in the art can readily provide various implementations of the circuitry shown in FIGS. 1C and 1D.

The above described trimming technique generally can be used for laser cutting the trim links selected by the algorithm of FIG. 2 in an un-packaged integrated circuit 55A.

However, if an integrated circuit chip 55B as shown in FIG. 1B is already packaged, then a direct electrical connection, rather than a probe connection, must be made to the input terminals 46 and 47 and output terminal 53 to perform the input offset trimming process. In this case, fuse blowing control logic circuitry 78 must be included in the packaged chip 55B as shown in FIG. 1B in order to select the fuses in series with selected trim current sources in such a manner as to cause a sufficiently large current to flow through the selected fuses to blow them in response to outcomes of the algorithm of FIG. 2. The system 40B shown in FIG. 1B is similar to the system 40A in FIG. 1A, except that the controlled laser system 75 of FIG. 1A is omitted, and in FIG. 1B chip 55B includes above mentioned fuse blowing logic control circuitry 78, which is coupled by a bus 65 to microcontroller 73 and also coupled by buses 79 and 80 to the various fuses in positive side trim array 56 and negative side trim array 60, respectively.

The algorithm of FIG. 2 can be executed by microcontroller 73 to correct or compensate for an input offset voltage Vos of operational amplifier 55A of FIG. 1A or 55B of FIG. 1B due to component mismatches in untrimmed operational amplifier 41. Vos could, for example, be as much as about +−2 millivolts. The invention accomplishes the needed correction or compensation of Vos by trimming it down to an acceptably low value in such a way that when the trimming process is complete there are a minimal number of active trim current sources.

Initially, all of the fuses or laser-cuttable links in trim arrays 56 and 60 are intact. That is, all of the trim current sources in trim arrays 56 and 60 are initially electrically coupled to conductors 48 and 49, respectively. Blowing a fuse or laser-cutting a link has the effect of electrically disconnecting a trim current source (or a voltage trim element in other possible embodiments of the invention) from conductor 48 or conductor 49.

For brevity, an example of a 4-bit trim operation for blowing fuses in accordance with the present invention will be explained with reference to FIGS. 1B and 2. In this example, an input offset voltage value of Vos equal to +1100 microvolts will be assumed for 4-bit (i.e., N=4) trim arrays 56 and 60. The MSB bit weight in trim arrays 56 and 60 is assumed to be equal to 1000 microvolts, and the bit weight of each successive bit is equal to half of the previous bit weight. In the flow chart of FIG. 2, the software variable "bit" is assigned a value of 4 for the MSB of trim arrays 56 and 60, a value of 3 for the MSB-1 bit, a value of 2 for the MSB-3 bit, and a value of 1 for the LSB bit. Therefore, in the present example the bit weights of the MSB, MSB-1, MSB-2 and MSB-3 (=LSB) bits are 1000 microvolts, 500 microvolts, 250 microvolts, and 125 microvolts, respectively.

Also, a convention is adopted for the purpose of explaining the present example wherein it is assumed that blowing a fuse in positive side trim array 56 has the effect of reducing the positive (+) input offset voltage Vos of untrimmed operational amplifiers 55A of FIGS. 1 and 55B of FIG. 1B. With this convention in mind, and referring to FIGS. 1B and 2, it will be assumed in the present example that the initial value of Vos of untrimmed operational amplifier 55B is equal to +1100 microvolts.

The program being executed by microcontroller 73 first goes to block 10 of FIG. 2 and sets "bit" equal to the bit number of the MSB of trim arrays 56 and 60, i.e., sets "bit" equal to 4. The program then goes to block 11 and measures the present value of Vos, which is assumed to be +1100 microvolts. The program then goes to decision block 14. Since Vos=+1100 microvolts is greater than 0, the determination in decision block 14 is affirmative.

The program then goes to block 23 and blows fuse 57-1 in positive side trim array 56. That reduces the value of Vos by 1000 microvolts, reducing its present value to +100 microvolts. The program then goes to block 25 and measures the +100 microvolt value of Vos.

It should be noted that since the difference between the values of Vos measured in block 11 and 25 is the result or effect of blowing fuse 57-1, it therefore is known that the weight of all of MSB trim current source 56-1 is equal to 1000 microvolts. Therefore, the weight of an LSB is equal to 125 microvolts, which is the result of dividing 1000 microvolts by 2 three times in succession. That is, the weight of an LSB can be calculated or extrapolated from the MSB according to the expression LSB=MSB(measured)/2^(N−1) for binary weighted trim cells. Therefore, −LSB/2 is equal to −62.5 microvolts. In contrast to the prior art, this calculation does not require previous knowledge of bit weights, as it was determined from the first two Vos measurements of blocks 11 and 25.

Next, the program goes to decision block 26 and determines that the present +100 microvolt value of Vos is not less than the value of −LSB/2, i.e., is not less than −62.5 microvolts. Therefore, the program goes to decision block 2, and produces a negative determination, since "bit" presently is equal to 4. The program then goes to block 24 and decrements "bit" to the next lower bit value of trim networks 56 and 60, i.e., to the bit number MSB-1 which is equal to 3. The program then goes to block 23 and blows the MSB-1 fuse 57-2 in positive side trim array 56. This trims, i.e., in this case subtracts, 500 microvolts from the previous +100 microvolt measurement of Vos, so the present value of Vos is now −400 microvolts.

The program then goes to block 25 and measures the −400 microvolt value of Vos. The program then goes to decision block 26. The present −400 microvolt value of Vos is less than the −62.5 microvolt value of −LSB/2, so the determination of decision block 26 is affirmative. The program then goes to block 28 and blows the corresponding MSB-1 fuse 62-2 in negative side trim array 60. This increases Vos by 500 microvolts, so the present value of Vos increases from −400 microvolts to +100 microvolts. The determination of decision block 29 is negative because "bit" is presently equal to the bit number MSB-1 (i.e., "bit" is equal to 3) whereas the bit number of LSB is 1. Therefore, the program goes to block 13 and decrements "bit" to the bit number of MSB-2, i.e., to "bit"=4−2=2. The program then goes to block 11 and measures the present +100 microvolt value of Vos.

The program then goes to decision block 14. Since +100 microvolts is greater than 0, the determination of decision block 14 is affirmative. The program being executed by microcontroller 73 then goes to block 23 and blows MSB-2 fuse 57-3 in positive side trim array 56. This subtracts 250 microvolts from the present +100 microvolt value of Vos, so the present value of Vos becomes −150 microvolts. The program then goes to decision block 25 and measures the −150 microvolt value of Vos. The program then goes to decision block 26. Since the present −150 microvolt value of Vos is less than the −62.5 microvolt value −LSB/2, the determination of decision block 26 is affirmative. Therefore, the program goes to block 28 and blows the MSB-2 fuse 62-3 in negative side trim array 60, which adds 250 microvolts to the value of Vos, increasing its present value to +100 microvolts.

Since the present value of "bit" is the MSB-2 bit number 2 and the bit number of LSB is 1, the determination of block 29 is negative. The program then goes to block 13 and decrements "bit" to the value MSB-3, i.e., to "bit"=1, which for the purpose of this simplified example is the bit number of LSB in trim arrays 56 and 60. The program goes to block 11 and measures the +100 microvolt value of Vos and then goes to decision block 14, where the present +100 microvolt value of Vos results in an affirmative determination in decision block 14. The program then goes to block 23 and blows LSB fuse 57-N (where N=4) in positive side trim array 56. This in effect subtracts 125 microvolts from the present +100 microvolt value of Vos, decreasing its present value to −25 microvolts. The program then goes to block 25 and measures the present −25 microvolt value of Vos. Since the −25 microvolt value of Vos is not less than −LSB/2 (i.e., not less than −62.5 microvolts), the determination of decision block 26 is negative. The program therefore goes to decision block 27, which determines that the present value of "bit"=1 is now equal to the bit number of LSB. Therefore, the trim procedure is now complete, as indicated in block 22.

In the present example, all of the fuses in positive side trim array 56 have now been cut, so there are no residual trim current sources in positive side trim array 56. Two of the fuses 62-2 and 62-3 in negative side trim array 60 have been cut, and the result is that Vos has been trimmed from the relatively large+1100 microvolt value to a negligible value of −25 microvolts.

Consequently, "trimmed" operational amplifier 55B now has a negligible input offset voltage Vos and a substantially reduced susceptibility to the above mentioned problems of thermal drift, power supply drift, circuit noise, and/or power consumption caused by residual trim elements in the prior art.

At this point, it may be helpful to provide a more generalized explanation of the foregoing procedure. As long as Vos remains above −62.5 microvolts, the algorithm represented by the flowchart of FIG. 2 keeps going through the loop including blocks 23, 25, 26, 27, and 24, each time blowing a fuse in positive side trim array 56 so as to lower Vos, and also decrementing "bit" to the next lower significant bit value, until all fuses have been blown in positive side trim array 56. However, if enough fuses in positive side trim array 56 are blown to cause Vos to be less than −62.5 microvolts, then the algorithm blows the fuse corresponding to the present value of "bit" in order to increase Vos to value higher than −62.5 microvolts, as indicated in block 28 of FIG. 2. If the present value of "bit" is not yet down to the LSB bit number, then the algorithm decrements "bit" as indicated in block 13, re-enters the above loop, and continues until all fuses in positive trim array 56 have been blown. The procedure is entirely analogous if the algorithm goes to the right portion of the flowchart of FIG. 2 as a result of a negative determination in decision block 14.

The foregoing example is, of course, equally applicable to the system shown in FIG. 1A, which has laser-cuttable links instead of fuses.

A variation of the foregoing example of the operation of the algorithm represented by FIG. 2 will be explained next, wherein a negative, rather than positive, initial value of −1400 microvolts is assumed for Vos. In this case, a negative decision is made in block 14 of FIG. 2, which causes the algorithm to go through the left, rather than the right, portion of the flow chart.

When the program first goes to block 11, the initial −1400 microvolt value of Vos is measured. The next outcome of decision block 14 then is negative. The program therefore goes to block 15 and blows MSB fuse 62-1 in negative side trim array 60, which has a weight of 1000 microvolts. This increases Vos from −1400 microvolts to −400 microvolts. The program then goes to block 17 and measures the −400 microvolt value of Vos. The next determination of decision block 18 therefore is negative. Since "bit" is equal to 4 and LSB is equal to 1, the outcome of decision block 19 is negative. Therefore, the program goes to block 16 and decrements "bit" from the value MSB=4 to the value MSB-1=3. The program then goes to block 15 and blows MSB-1 fuse 62-2 in negative side trim array 60, which adds 500 microvolts to the value of Vos. The present value of Vos therefore increases from −400 microvolts to +100 microvolts. The program then goes to block 17, which measures the present +100 microvolt value of Vos.

The program then goes to decision block 18, the determination of which is affirmative because +100 microvolts is greater than −LSB/2=−62.5 microvolts (wherein the value of LSB/2 is determined by previous measurements and does not require foreknowledge of the bit weights). The program then goes to block 28 and blows fuse 57-2 in positive trim array 56, which in effect subtracts 500 microvolts from Vos so its present value is reduced from +100 microvolts to −400 microvolts. The program then goes to decision block 21 and makes a negative determination because the present value of "bit"=3 is not equal to LSB=1. The program then goes to block 12 and decrements "bit" to the value MSB-2=2. The program then goes to block 11 and measures the −400 microvolt value of Vos. This results in a negative determination in decision block 14, so the program goes to block 15 and blows MSB-2 fuse 62-3 in negative side trim array 60. This adds 250 microvolts to Vos, increasing its present value from −400 microvolts to −150 microvolts.

The program then goes to block 17 and measures the −150 microvolt value of Vos. This causes a negative determination in block 18. The next determination in decision block 19 is negative because "bit" is equal to 2 rather than LSB=1. The program then goes to block 16 and decrements "bit" from 2 to 1, i.e., to the bit number of LSB. The program then goes to block 15 and blows 125 microvolt MSB-3 fuse 62-N (where N=4) in negative side trim array 60. This increases adds 125 microvolts to the prior −150 microvolt value of Vos, increasing its value to −25 microvolts. The program then measures the −25 microvolt value of Vo, as indicated in block 17, and then goes block 18 and makes a negative determination. The program then goes block 19 and makes a determination that "bit" is equal to LSB=1.

Therefore, as indicated in block 22, the trim procedure is now complete. All of the fuses in negative side trim array 60 have been blown, so there are no residual trim current sources in negative side trim array 60. Also, positive side trim array 57 is left with fuse 57-2 cut and its other three fuses intact. Vos has been reduced from the initial relatively large-magnitude value of −1400 microvolts to the relatively negligible low value of −25 microvolts. Again, "trimmed" operational amplifier 55A now has a negligible input offset voltage Vos and a substantially reduced susceptibility to the above mentioned problems of thermal drift, power supply drift, circuit noise, and/or power consumption caused by residual trim elements in the prior art.

If all of the trim current sources are perfectly binarily weighted, then the trimming algorithm represented by the flow chart of FIG. 2 will repeatedly go down either the right side or repeatedly go down the left side of the flow chart for the entire trimming process, with the same decision being made each time in decision block 14. However, there are other various possible examples wherein component mismatching and un-evenness in the bit weights of the various trim current sources in trim arrays 57 and 60 may result in both affirmative and negative decisions in decision block 14 in FIG. 2, rather than only affirmative outcomes of decision block 14 as in the above example for an initial Vos value of +1100 microvolts or only negative outcomes of decision block 14 for the above other example with an initial Vos value of −1400 microvolts.

In any case, at the end of the trimming procedure according to the algorithm represented by the flow chart of the FIG. 2, all of the trim current sources on one side of the differential input transistor pair are disconnected from the corresponding conductor 48 or 49 as a result of the blowing or cutting all of the corresponding fuse or links 57-1,2 . . . N or 62-1,2 . . . N. The result of the trimming procedure of the present invention is that after the trimming procedure has been completed, there are no more trim current sources connected to one side of the differential input transistor pair. On the other side of the input differential pair, the total amount of trim current determined by which fuses or links have been blown or laser-cuts will have a value that is needed to reduce the input offset voltage of the differential input pair to an acceptable low level, and that total amount of trim current is injected into the corresponding conductor 48 or 49.

As a result of eliminating of all trim current sources in one of the trim arrays 56 or 60 and minimizing of the number of trim current sources in the other, the trimmed operational amplifier 55B has lower thermal drift and lower power supply drift, and also lower noise and lower power consumption than is the case is the prior art techniques are utilized. This is because a residual trim due to trim current sources (which are added redundantly to each side of the differential input transistor pair) is subject to drift errors and may also add uncorrelated thermal noise to the system, typically adding small but potentially significant offset and noise.

The accuracy of the final "trimmed" the value of Vos is determined by the value of N, i.e., the number of binarily weighted (or otherwise weighted) bits in the two trim arrays 56 and 60.

The above-described technique has the capability of extrapolating what the weight of the LSB should be on the basis of the just-determined effect of the weight of the MSB. Therefore, the technique of the present invention does not require a-priori information regarding the weights of the various trim current sources corresponding to the various bits of the trim arrays 56 and 60, so it is not a problem if the weights vary from wafer-to-wafer or device-to-device.

To summarize, the method of the present invention as described in the above examples provides two arrays of binarily weighted "fused" trim current cells, and provides an algorithm for blowing the fuses or cutting equivalent laser-cuttable links such that the trim residual is minimized and also such that the trim is accurate to within ½ LSB. Initially, intact fuse links force weighted trim current or voltage elements to be "on". The algorithm determines which fuses are blown in order to disconnect various weighted trim elements. The method results in the minimum amount of residual trim current or trim voltage necessary for balancing the parameter to be trimmed in one trim arrays, and leads to zero residual trim current or trim voltage in the other trim array.

In cases of a particular device under test in which the parameter to be trimmed has a small deviation from a desired mean value, the present method provides a very small trim residual, thereby minimizing second-order effects and disturbances on the device's behavior. This is an improvement over the prior art, in which equal and opposite trim voltages or trim currents are added.

The above described trimming method is also applicable for non-binarily weighted discrete steps, such as $(1.95)^n$ weighting. This may be advantageous in order to create some "overlap" to compensate for mismatches between MSB-weighted current sources and LSB-weighted current sources, as well as mismatches between positive and negative trim banks. This "overlap" can compensate for inevitable lithography and processing mismatches while paying a small price in overall trim range. The resulting value of input offset voltage Vos nevertheless is nearly minimized for the technique wherein all of the fuses are blown (or wherein, in the embodiment of FIG. 1A, all of the laser-cuttable links are cut) in one trim array and the remaining unblown fuses in the other trim array produce the minimum amount of trim current necessary to correct or compensate the initial relatively large value of Vos.

The differential trimming procedure of the present invention can be used for trimming of other circuit parameters than input offset voltage Vos. For example, common mode rejection, output parameters such as referenced voltage or oscillator frequency, input impedance, input bias current, or filter pole/zero location could be trimmed by use of the same methodology.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A method of trimming a parameter of an integrated circuit including first and second conductors each of which can be incrementally adjusted to accomplish trimming of the parameter, the integrated circuit also including a first trim array including a plurality of weighted trim elements each having a corresponding bit number and each coupled to a corresponding interruptible link which determines whether that trim element is operatively coupled to the first conductor and a second trim array including a plurality of weighted trim elements each having the same bit number as a weighted trim element of the first trim array and each coupled to a corresponding interruptible link which determines whether that trim element is operatively coupled to the second conductor, the method comprising:

(a) measuring an initial value of the parameter;

(b) determining whether the parameter has a first relationship to a predetermined reference value;

(c) as long as the parameter has the first relationship to the predetermined reference value, repetitively interrupting a link of the first trim array having a bit number and decrementing the bit number to change the parameter in a first direction by weighted amounts corresponding to the bit number values until either all links of the first trim array have been interrupted or links of the first trim array have been interrupted to cause the parameter to become less than a first accuracy value;

(d) interrupting an interruptible link of the second trim array corresponding to the present bit number if step (c) determines that the present value of the parameter has the first relationship to the predetermined accuracy value; and (e) if in step (d) all of the all links in the first trim array have not yet been interrupted, decrementing the bit number and repeating steps (b), (c), (d), and (e) until all of the all links of the first trim array have been interrupted.

2. The method of claim 1 wherein the integrated circuit includes an operational amplifier and wherein the parameter is an input offset voltage of the operational amplifier.

3. The method of claim 1 including setting an initial value of the bit number to the bit number of the most significant bit of the first trim array before performing step (c).

4. The method of claim 1 wherein each interruptible link includes a fuse, and interrupting of the interruptible link includes blowing the fuse.

5. The method of claim 1 wherein each interruptible link includes a laser-cuttable link, and interrupting of the interruptible link includes laser-cutting the laser-cuttable link.

6. The method of claim 1 wherein the predetermined accuracy value has a magnitude equal to the magnitude of half of the accuracy value of a least significant bit of the first trim array.

7. The method of claim 1 including operating a processor in order to perform steps (a) through (e).

8. The method of claim 1 wherein the trimming of the parameter is complete if in step (d) it is determined that all links in the first trim array have been interrupted.

9. The method of claim 1 including operating a processor to perform steps (a)–(e).

10. A method of trimming a parameter of an integrated circuit including first and second conductors each of which can be incrementally adjusted to accomplish trimming of the parameter, the integrated circuit also including a first trim array including a plurality of weighted trim elements each having a corresponding bit number and each coupled to a corresponding interruptible link which determines whether that trim element is operatively coupled to the first conductor and a second trim array including a plurality of weighted trim elements each having the same bit number as a weighted trim element of the first trim array and each coupled to a corresponding interruptible link which determines whether that trim element is operatively coupled to the second conductor, the method comprising:

(a) measuring an initial value of the parameter, (b) determining whether the parameter exceeds a predetermined reference value;

(c) as long as the parameter exceeds the predetermined reference value, repetitively interrupting a link of the first trim array having a bit number and decrementing the bit number to decrease the parameter by weighted amounts corresponding to the bit number values until either all links of the first trim array have been interrupted or enough links of the first trim array have been interrupted to cause the parameter to become less than a first accuracy value;

(d) interrupting an interruptible link of the second trim array corresponding to the present bit number if step (c) determines that the present value of the parameter is less than the first accuracy value; and (e) if in step (d) all of the all links in the first trim array have not yet been interrupted, decrementing the bit number and repeating steps (b), (c), (d), and (e) until all of the all links of the first trim array have been interrupted.

11. The method of claim 10 wherein, if in step (b) the parameter does not exceed the first reference value, then performing the steps of (f) as long as the parameter is less than the predetermined reference value, repetitively interrupting a link of the second trim array having the present bit number and decrementing the bit number to increase the parameter by weighted amounts corresponding to the bit number values until either all links of the second trim array have been interrupted or enough links of the second trim array have been interrupted to cause the parameter to exceed a second accuracy value;

(g) interrupting an interruptible link of the first trim array corresponding to the present bit number if step (f) determines that the present value of the parameter exceeds the second accuracy value; and (h) if in step (g) all of the all links in the first trim array have not yet been interrupted, decrementing the present bit number and repeating steps (f), (g), and (h) until all of the all links of the first trim array have been interrupted.

12. The method of claim 10 wherein the integrated circuit includes an operational amplifier and wherein the parameter is an input offset voltage of the operational amplifier.

13. The method of claim 10 including setting an initial value of the bit number to the bit number of the most significant bit of the first trim array before performing step (c).

14. The method of claim 10 wherein each interruptible link includes a fuse, and interrupting of the interruptible link includes blowing the fuse.

15. The method of claim 10 wherein each interruptible link includes a laser-cuttable link, and interrupting of the interruptible link includes laser-cutting the laser-cuttable link.

16. The method of claim 10 wherein the predetermined accuracy value has a magnitude equal to the magnitude of half of the accuracy value of a least significant bit of the first trim array.

17. The method of claim 10 including operating a processor in order to perform steps (a) through (e).

18. The method of claim 10 wherein the trimming of the parameter is complete if in step (d) it is determined that all links in the first trim array have been interrupted.

19. The method of claim 10 including operating a processor to perform steps (a)–(e).

20. A method of trimming a parameter of an integrated circuit including first and second conductors each of which can be incrementally adjusted to accomplish trimming of the parameter, the integrated circuit also including a first trim array including a plurality of weighted trim elements each having a corresponding bit number and each coupled to a corresponding interruptible link which determines whether that trim element is operatively coupled to the first conductor and a second trim array including a plurality of weighted trim elements each having the same bit number as a weighted trim element of the first trim array and each coupled to a corresponding interruptible link which determines whether that trim element is operatively coupled to the second conductor, the method comprising:
   (a) measuring an initial value of the parameter;
   (b) determining whether the parameter exceeds a predetermined reference value;
   (c) interrupting a link of the first trim array having a bit number to decrease the parameter by a weighted amount corresponding to the bit number if step (b) determines that the parameter exceeds the predetermined reference value;
   (d) measuring a present value of the parameter and determining if the present value of the parameter exceeds a first accuracy value;
   (e) determining whether the bit number is a LSB bit number of the first and second trim arrays if step (d) determines that the present value of the parameter does not exceed the first accuracy value;
   (f) decrementing the bit number and repeating steps (c), (d), (e), and f) for the decremented bit number if the bit number is not the LSB bit number, the trimming of the parameter being complete if the present bit number is equal to the LSB bit number;
   (g) interrupting an interruptible link of the second trim array corresponding to the present bit number if step (d) determines that the present value of the parameter is less than the first accuracy value, the trimming of the parameter being complete if the bit number is equal to the LSB bit number;
   (h) decrementing the bit number if it is not equal to the LSB bit number; and
   (i) measuring the value of the parameter and repeating steps (c), (d), (e) and (f) if the present bit number is equal to the LSB bit number.

21. The method of claim 20 wherein the integrated circuit includes an operational amplifier and wherein the parameter is an input offset voltage of the operational amplifier.

22. The method of claim 20 including setting an initial value of the bit number to the bit number of a most significant bit of the first trim array before performing step (c).

23. The method of claim 20 wherein each interruptible link includes a fuse, and interrupting of the interruptible link includes blowing the fuse.

24. The method of claim 20 wherein each interruptible link includes a laser-cuttable link, and interrupting of the interruptible link includes laser-cutting the laser-cuttable link.

25. The method of claim 20 wherein the predetermined accuracy value has a magnitude equal to half of the magnitude of the accuracy value of a least significant bit of the first trim array.

26. The method of claim 20 including operating a processor in order to perform steps (a) through (e).

27. The method of claim 20 including operating a processor to perform steps (a)–(l).

28. A system for trimming a parameter of an integrated circuit including first and second conductors each of which can be incrementally adjusted to accomplish trimming of the parameter, the integrated circuit also including a first trim array including a plurality of weighted trim elements each having a corresponding bit number and each coupled to a corresponding interruptible link which determines whether that trim element is operatively coupled to the first conductor and a second trim array including a plurality of weighted trim elements each having the same bit number as a corresponding weighted trim element of the first trim array and each coupled to a corresponding interruptible link which determines whether that trim element is operatively coupled to the second conductor, the method comprising:
   (a) means for measuring an initial value of the parameter;
   (b) means for determining whether the parameter has a first relationship to a predetermined reference value;
   (c) means for repetitively interrupting a link of the first trim array having a bit number and decrementing the bit number to change the parameter in a first direction by weighted amounts corresponding to the bit number values until either all links of the first trim array have been interrupted or enough links of the first trim array have been interrupted to cause the parameter to have a second relationship a predetermined accuracy value as long as the parameter has the first relationship to the predetermined reference value;
   (d) means for interrupting an interruptible link of the second trim array corresponding to the present bit number if the present value of the parameter has the second relationship to the predetermined accuracy value to change the parameter to a value such that its does not have the second relationship to the predetermined accuracy value; and
   (e) means for repeating the functions restated in elements s (b), (c), and (d) until all of the all links of the first trim array have been interrupted if all of the all links in the first trim array have not yet been interrupted.

29. The system of claim 28 wherein each interruptible link includes a fuse, and wherein interrupting of the interruptible link includes blowing the fuse, the integrated circuit including fuse blowing logic control means coupled to a processor for selecting and blowing fuses.

30. The system of claim 28 wherein each interruptible link includes a laser-cuttable link, and wherein interrupting of the interruptible link includes controlling a laser system to precisely align a laser beam of the laser system with the laser-cuttable link and firing the laser beam.

* * * * *